United States Patent
Himori et al.

(10) Patent No.: US 7,112,926 B2
(45) Date of Patent: Sep. 26, 2006

(54) MATCHING UNIT AND PLASMA PROCESSING SYSTEM

(75) Inventors: Shinji Himori, Nirasaki (JP); Mitsuhiro Yuasa, Tokyo-To (JP); Kazuyoshi Watanabe, Niiza (JP); Jun'ichi Shimada, Niiza (JP)

(73) Assignees: Tokyo Electron Limited, Tokyo-To (JP); Tokyo Hy-Power Labs, Inc., Saitama-ken (JP)

( * ) Notice: Subject to any disclaimer, the term of this patent is extended or adjusted under 35 U.S.C. 154(b) by 755 days.

(21) Appl. No.: 10/120,526

(22) Filed: Apr. 12, 2002

(65) Prior Publication Data

US 2002/0134508 A1 Sep. 26, 2002

Related U.S. Application Data

(63) Continuation-in-part of application No. PCT/JP00/07083, filed on Oct. 12, 2000.

(30) Foreign Application Priority Data

Oct. 15, 1999 (JP) ............................................ 11-294527

(51) Int. Cl.
*H05H 1/24* (2006.01)

(52) U.S. Cl. ............................. 315/111.21; 156/345.44
(58) Field of Classification Search ............ 315/111.21, 315/111.71; 156/345.44, 345.43, 345.46; 118/723 E, 723 I See application file for complete search history.

(56) References Cited

U.S. PATENT DOCUMENTS 5,865,937 A * 2/1999 Shan et al. ............ 156/345.44

6,155,202 A 12/2000 Nakano et al. ............. 118/723

FOREIGN PATENT DOCUMENTS

| JP | 5-198390 | 8/1993 |
|---|---|---|
| JP | 10-25583 | 1/1998 |
| JP | 11-297496 | 10/1999 |
| JP | 11-330058 | 11/1999 |
| JP | 2000-12286 | 1/2000 |
| JP | 2000-252099 | 9/2000 |

OTHER PUBLICATIONS

Notification of the Recording of a Change (Form PCT/IB/306).
Preliminary Examination Report (in Japanese)—Form PCT/IPEA/409.

(Continued)

*Primary Examiner*—David Vu
(74) *Attorney, Agent, or Firm*—Smith, Gambrell & Russell, LLP

(57) ABSTRACT

There are provided a matching unit capable of sufficiently matching the impedance of a high frequency load to a transmission path impedance without increasing its size and matching time even if a high frequency power of 70 MHz or higher is supplied thereto, and a plasma processing system using the same. A matching unit 41 comprises: a resonance rod 61 for transmitting a high frequency energy from a high frequency power supply 40 to a plasma producing electrode; a variable capacitor 62, connected to the resonance rod 61 and an electrode 21 in series, for adjusting the imaginary part of an impedance complex number; a housing 63 which is provided outside of the resonance rod 61 and which is grounded; a link coil 64 for exciting a high frequency energy to the resonance rod 61 and for adjusting the real part of the impedance complex number; and a controller 69 for controlling a driving part for the variable capacitor 62 and the link coil 64 so that a series resonance circuit is formed between the high frequency power supply 40 and the ground via plasma in a matching state.

21 Claims, 14 Drawing Sheets

OTHER PUBLICATIONS

Form PCT/IPEA/401 (in Japanese).
International Search Report (Form PCT/ISA/210).
Cover page of PCT Publication WO 01/28300 A1 of PCT/JP00/07083.
Notice Informing the Applicant of the Communication of the International Application to the Designated Offices (Form PCT/IB/308).
Notification of Receipt of Record Copy (Form PCT/IB/301).
Notification Concerning Submission or Transmittal of Priority Document (Form PCT/IB/304).

PCT Notification of Transmittal of Copies of Translation of the International Preliminary Examination Report (PCT/IB/338) issued for PCT/JP00/07083.

International Preliminary Examination Report (PCT/IPEA/409) (translated) issued for PCT/JP00/07083.

Japanese Patent Laid–Open No. 162696/1999, Application No. 343684, issued on Jun. 18, 1999.

* cited by examiner

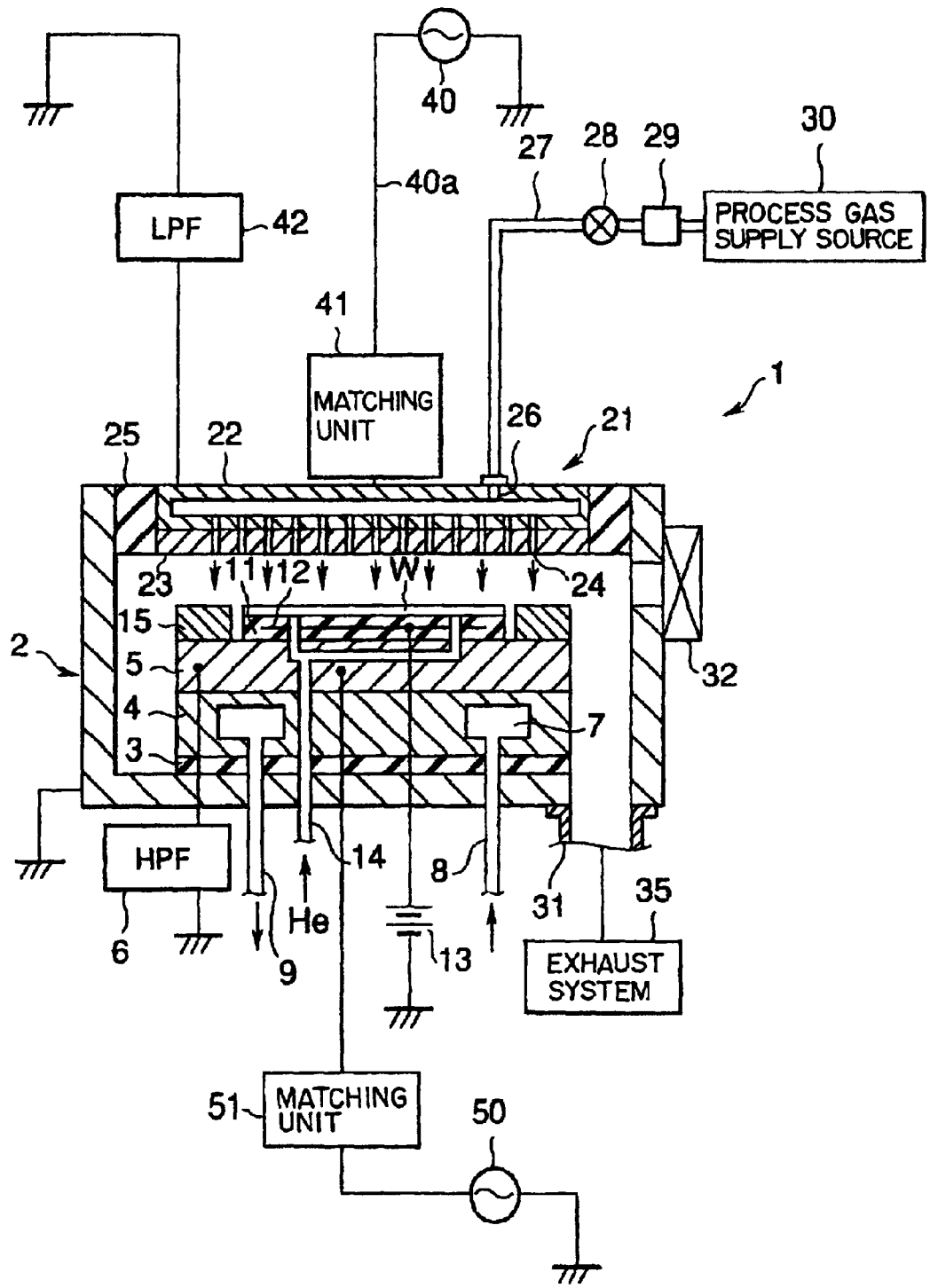
F I G. 1

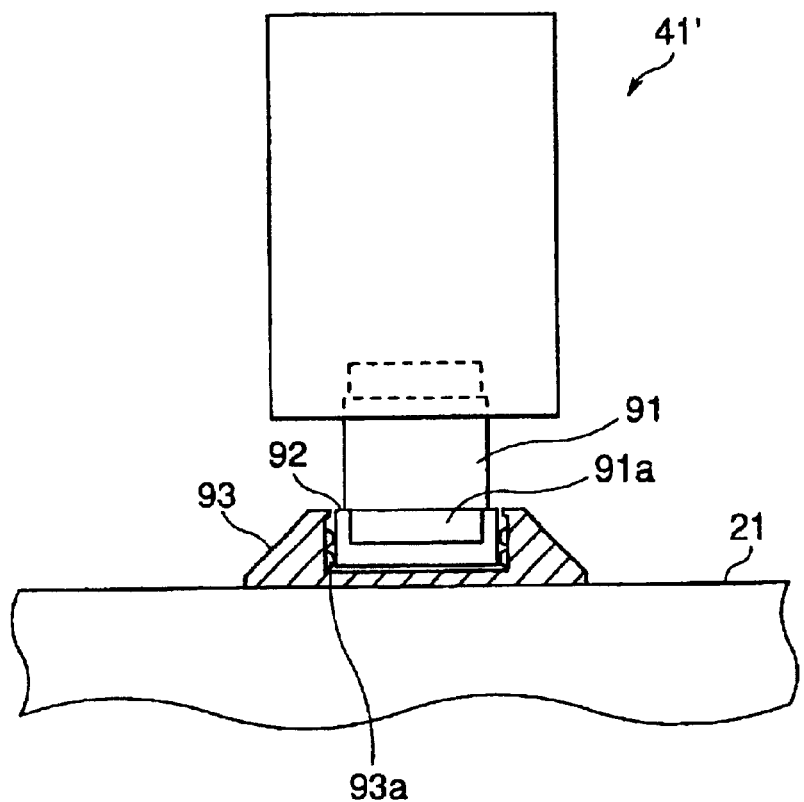
F I G. 12
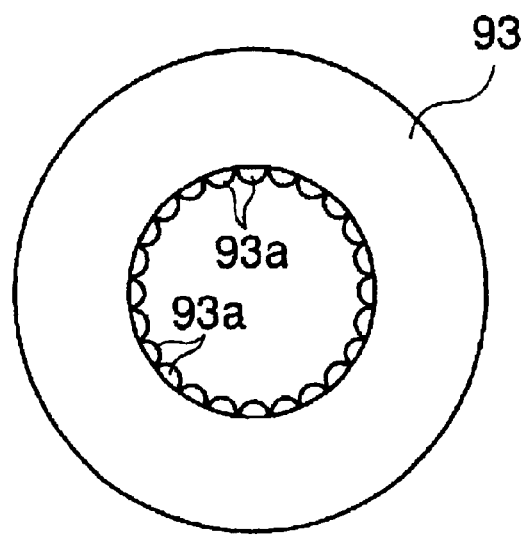
F I G. 13

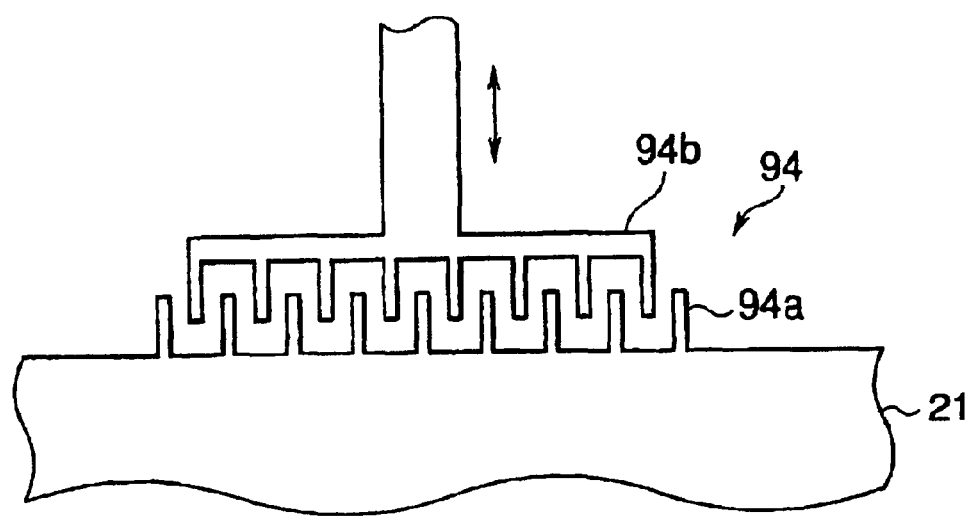
F I G. 14
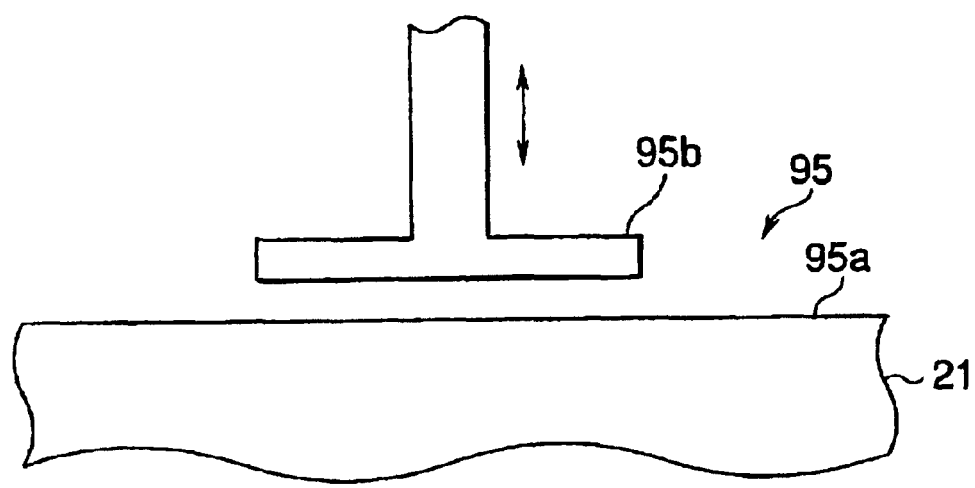
F I G. 15

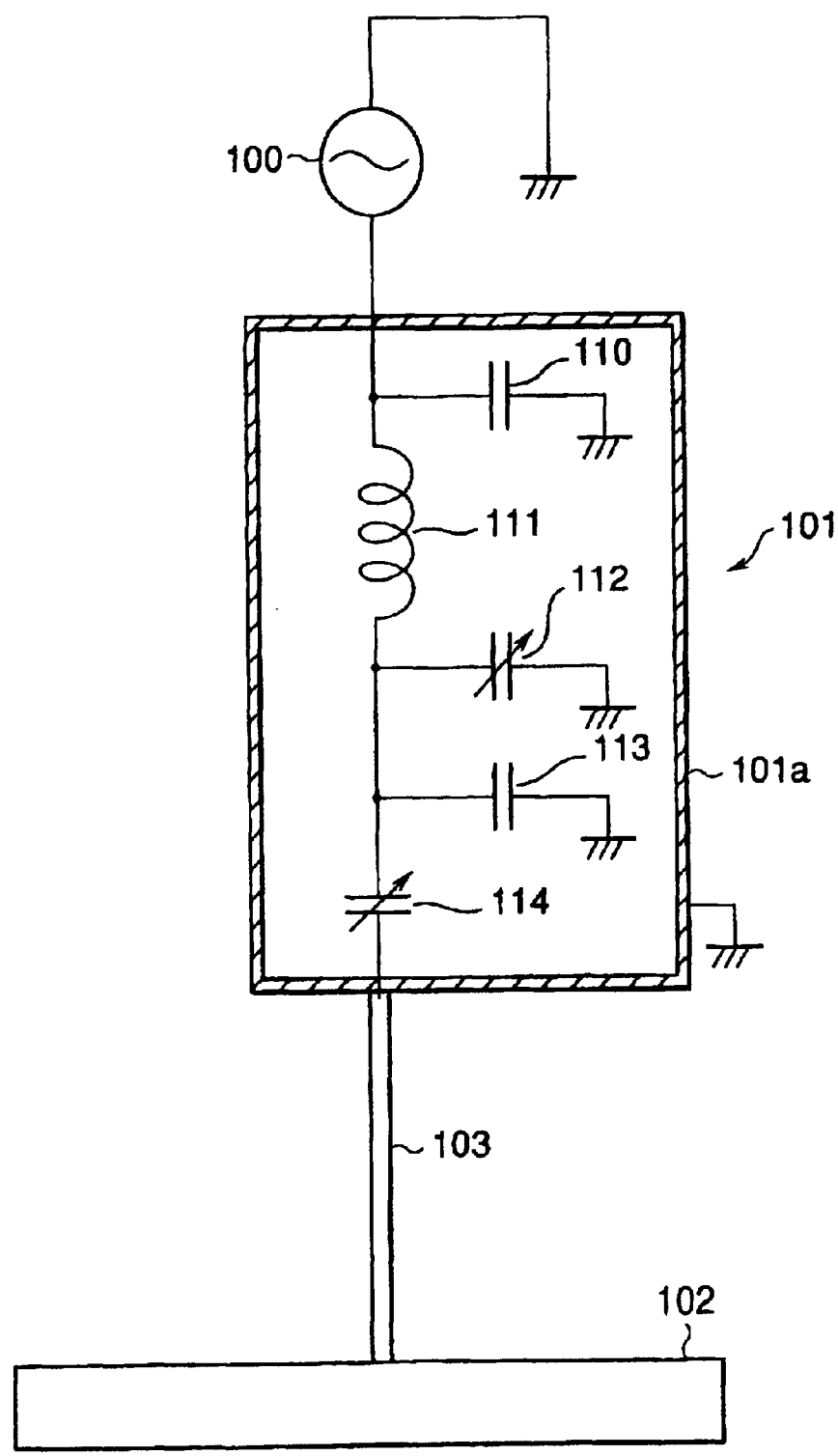
F I G. 16

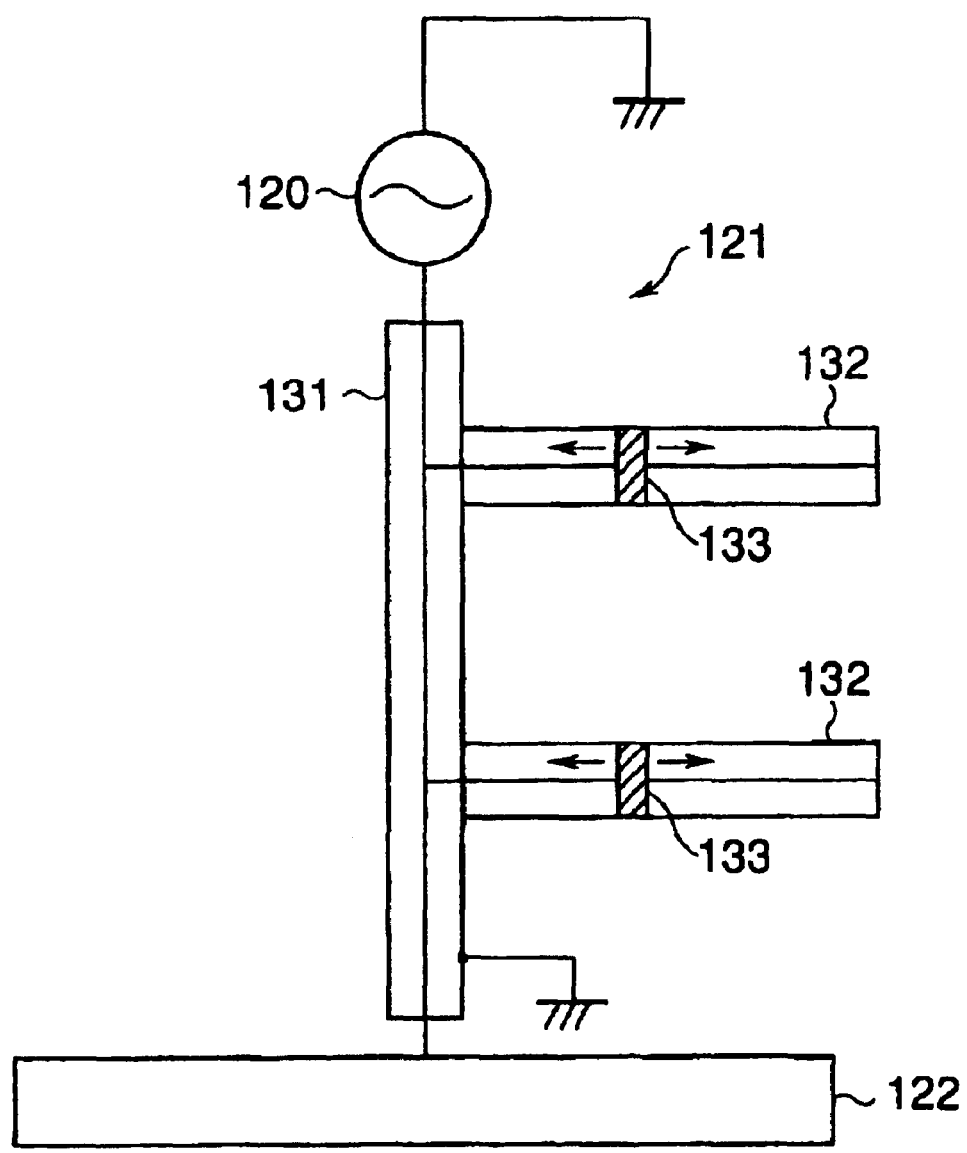
F I G. 17

MATCHING UNIT AND PLASMA PROCESSING SYSTEM

CROSS REFERENCE TO RELATED APPLICATION

This application is a continuation-in-part of prior application No. PCT/JP00/07083 filed Oct. 12, 2000 and is being incorporated herein, by reference.

TECHNICAL FIELD

The present invention relates generally to a matching unit for matching impedance of a high frequency load, such as plasma, to impedance of a transmission path, and a plasma processing system using the same.

BACKGROUND ART

For example, in a process for fabricating semiconductor devices, various plasma processes, such as etching, sputtering and CVD (chemical vapor deposition), are used for processing semiconductor wafers which are substrates to be processed.

As plasma processing systems for carrying out such plasma processes, various systems are used. Among these systems, capacitive coupled parallel plate plasma processing systems are mainly used.

The capacitive coupled parallel plate plasma processing system has a pair of parallel plate electrodes (top and bottom electrodes) in a chamber. This system is designed to feed a process gas into the chamber and to apply a high frequency power to at least one of the electrodes to form a high frequency field between the electrodes to form plasma of the process gas by the high frequency field to plasma-process semiconductor wafers.

If a film, e.g., an oxide film, on a semiconductor wafer is etched by means of such a capacitive coupled parallel plate plasma processing system, the optimum radical control can be carried out by causing the pressure in the chamber to be a medium pressure to form a medium density plasma. Thus, it is possible to obtain an appropriate plasma state, so that it is possible to realize stable and repeatable etching with a high etching selectivity.

However, in recent years, the scale down of the design rule for ULSIs is increasingly advancing, and a higher aspect ratio of a hole shape is required, so that conventional conditions are not always sufficient.

Therefore, it has been attempted to raise the frequency of the high frequency power to be applied, to about 60 MHz to form a high density plasma to an appropriate plasma under lower pressure conditions to cope with the scale down. However, it is difficult to produce a high density plasma at a degree of vacuum of 10 mTorr or less by the frequency of about 60 MHz. For that reason, it has been studied that the frequency of the high frequency power to be applied is further raised to 70 MHz or higher.

By the way, in the capacitive coupled parallel plate plasma processing system for thus applying a high frequency power to form plasma, a matching unit for matching impedance of plasma, which is the load of a high frequency power, to a transmission path impedance is provided between a high frequency power supply and a top electrode. A conventional matching unit has a structure shown in, e.g., FIG. 16. That is, a matching unit 101 is provided between a high frequency power supply 100 and a top electrode 102, and has a grounded rectangular parallelopiped box 101a, in which a coil 111 and a variable capacitor 114 are provided in series upstream of a feeding rod 103 for feeding power from the high frequency power supply 100 to the top electrode 102. Moreover, a grounded fixed capacitor 110 is provided upstream of the coil 111, and a variable capacitor 112 and a fixed capacitor 113 which are grounded are provided downstream of the coil 111. These parts are connected by copper plates or wires. By changing the values of the variable capacitors 112 and 114, the matching range is changed. Variable coils may be substituted for the variable capacitors.

However, if a matching unit with such a structure is used in a frequency band exceeding 70 MHz, the influence of the inductive reactance components of the copper plate for connecting the parts and the feeding rod for connecting the matching unit to the electrode increases. On the other hand, since capacitive reactance is in inverse proportion to frequency, the capacity of capacitors for resonance and matching is very small, so that it is difficult to utilize commercially-available variable capacitors. This tendency becomes remarkable when the frequency of the high frequency power is 100 MHz or higher.

In order to avoid such inconvenience, it is considered that a matching unit of a stub system, which is usually used for matching in the range of from the second half of the VHF band to the UHF band (300 MHz to 3 GHz), is used for a plasma processing system in a frequency band exceeding 100 MHz. As shown in FIG. 17, a matching unit 121 of a stub system is designed to adjust impedance by moving short-circuiting elements 133 on two or more adjusting lines 132 having coaxial cable structures, which are connected to and arranged perpendicularly to a feeding line 131 having a coaxial structure for connecting a high frequency power supply 120 to a top electrode 122.

However, in such a matching unit 121 of the stub system, the stroke of the short-circuiting elements 133 must be ensured to be ¼ wavelength or more. In the case of 150 MHz or less, the length of the adjusting lines 132 must be 500 mm or more, so that the matching unit itself is very large. In addition, the traveling time for the short-circuiting element 133 increases, so that the time required to match after the turning-on of the high frequency power increases. Moreover, considering that the short-circuiting element 133 is driven by a motor, it is not possible to avoid the complicated structure, such as conversion of rotational motion to linear motion.

On the other hand, the conventional matching unit is connected to the electrode by the feeding rod having a length of tens to about 100 mm, and the parts in the matching unit are connected by the copper plates or the like. If the number of mechanical connecting portions is thus large, the number of places in which electric characteristics are discontinuous increases. Therefore, standing waves are also discontinuous, so that plasma is ununiform, and loss due to R components increases. In addition, since the inductive reactance of the feeding rod becomes very large by the rising of frequency, the voltage at the outlet of the matching unit becomes very high, so that it is required to increase the size of insulating materials and spaces to reinforce insulation.

DISCLOSURE OF THE INVENTION

The present invention has been made in view of such circumstances. It is an object of the present invention to provide a matching unit capable of sufficiently matching impedance of a high frequency load to a transmission path impedance without increasing its size and matching time even if a high frequency power of 70 MHz or higher and further 100 MHz or higher is supplied thereto, and a plasma processing system using the same.

It is another object of the present invention to provide a matching unit capable of decreasing ununiformity and energy loss due to discontinuity of electric characteristics and of being miniaturized, and a plasma processing system using the same.

In order to accomplish the above described objects, according to the first aspect of the present invention, there is provided a matching unit, provided between a high frequency power supply and a high frequency load introducing part, for matching an impedance of a high frequency load with a transmission path impedance, the matching unit comprising: a resonance rod for transmitting a high frequency energy from a high frequency power supply to a high frequency load introducing part; a variable capacitor, connected to the resonance rod and the high frequency load introducing part in series, for adjusting an imaginary part of an impedance complex number; a housing which is provided outside of the resonance rod and which is grounded; and a variable coupling feeding part for exciting a high frequency energy to the resonance rod and for adjusting a real part of the impedance complex number, wherein the variable capacitor and the variable coupling feeding part are adjusted so that a series resonance circuit is formed between the high frequency power supply and the high frequency load in a state that the impedance of the high frequency load is matched with the transmission path impedance.

According to the second aspect of the present invention, there is provided a matching unit, provided between a high frequency power supply and a plasma producing electrode, for matching an impedance of a high frequency load with a transmission path impedance, the matching unit being mounted directly on the plasma producing electrode.

According to the third aspect of the present invention, there is provided a plasma processing system comprising: a chamber for housing therein an object to be processed; first and second electrodes which are provided so as to face each other in the chamber; a high frequency power supply for supplying a high frequency power to the first electrode; a matching unit, provided between the high frequency power supply and the first electrode, for matching a plasma impedance with a transmission path impedance; exhaust means for maintaining the interior of the chamber in a predetermined reduced pressure state; and process gas feed means for feeding a process gas into the chamber, the plasma processing system forming a high frequency electric field between the first and second electrodes by the high frequency power to produce the plasma of the process gas to carry out a plasma processing, the matching unit comprising: a resonance rod for transmitting a high frequency energy from the high frequency power to the first electrode; a variable capacitor, connected to the resonance rod and the first electrode in series, for adjusting an imaginary part of an impedance complex number; a housing which is provided outside of the resonance rod and which is grounded; and a variable coupling feeding part for exciting a high frequency energy to the resonance rod and for adjusting a real part of the impedance complex number, wherein the variable capacitor and the variable coupling feeding part are adjusted so that a series resonance circuit is formed between the high frequency power and the ground via the plasma in a state that the impedance of a high frequency load is matched with a transmission path impedance.

According to the fourth aspect of the present invention, there is provided a plasma processing system comprising: a chamber for housing therein an object to be processed; first and second electrodes which are provided so as to face each other in the chamber; a high frequency power supply for supplying a high frequency power to the first electrode; a matching unit, provided between the high frequency power supply and the first electrode, for matching a plasma impedance with a transmission path impedance; exhaust means for maintaining the interior of the chamber in a predetermined reduced pressure state; and process gas feed means for feeding a process gas into the chamber, the plasma processing system forming a high frequency electric field between the first and second electrodes by the high frequency power to produce the plasma of the process gas to carry out a plasma processing, the matching unit being mounted directly on the first electrode.

According to the first aspect of the present invention, there is formed the series resonance circuit including the resonance rod, which is surrounded by the housing, and the variable capacitor. Therefore, even if a high frequency power of 70 MHz or higher is supplied, a commercially available variable capacitor can be utilized for sufficiently matching the impedance of a high frequency load with the impedance of the transmission path without increasing the size of the matching unit unlike the stub system. That is, since the series resonance circuit is formed in the matching state between the high frequency power supply and the high frequency load as a simple structure that the matching unit, the resonance rod and the variable capacitor are arranged in series, it is possible to essentially miniaturize the matching unit. In addition, the inductance component itself of the resonance rod can be decreased by providing the grounded housing, and the inductive reactance component of the resonance circuit can be easily managed if the distance between the resonance rod and the housing is adjusted. Therefore, even if a commercially available variable capacitor is used, the impedance of the high frequency load can be sufficiently matched with the transmission path impedance. In addition, when the resonance rod is operated as a coil, the length of the resonance rod can be shorter than the ¼ wavelength of the frequency of the high frequency waves, so that it is possible to further miniaturize the unit. Moreover, since the number of connection points is small in the resonance circuit, it is possible to form a low-loss, high-performance resonance circuit having a low internal loss. In addition, since the variable capacitor is basically used for carrying out the matching similar to conventional units, the matching time is not long unlike the stub system. Moreover, the shielding effect can be enhanced due to the presence of the housing.

According to the second aspect of the present invention, since the matching unit is mounted directly on the plasma producing electrode, it is not required to provide the feeding rod, and it is possible to decrease the number of impedance discontinuous places. Therefore, it is possible to reduce ununiformity and energy loss due to the discontinuity of electric characteristics. In addition, since there is no influence of the inductive reactance component of the feeding rod, voltage is not raised at the outlet of the matching unit. Therefore, it is not required to increase the size of insulating materials and spaces to reinforce insulation, so that it is possible to miniaturize the unit.

According to the third aspect of the present invention, since the matching unit according to the first aspect of the present invention is used for forming the plasma processing system, even if a high frequency power of 70 MHz or higher is supplied to produce plasma, a commercially available variable capacitor can be utilized for sufficiently matching the impedance of plasma with the transmission path impedance without increasing the size of the system unlike the stub system.

According to the fourth aspect of the present invention, since the matching unit according to the second aspect of the present invention is used for forming the plasma processing system. Therefore, it is possible to reduce the ununiformity of plasma and energy loss due to the discontinuity of electric characteristics.

In the matching unit according to the first aspect of the present invention, a plasma producing electrode may be used as the high frequency load introducing part. In this case, the high frequency load is plasma.

The matching unit according to the first aspect of the present invention may further comprise control means for controlling the variable capacitor and the variable coupling feeding part. Thus, it is possible to automatically adjust so as to form a series resonance circuit in the matching state between the high frequency power supply and the high frequency load.

The resonance rod and the housing are preferably provided so as to be coaxial with each other. Thus, the distance between the resonance rod and the housing is constant regardless of their positions, so that the distribution of the electromagnetic field can be uniform. Therefore, it is easy to manage the estimation of inductance of the resonance rod.

The variable coupling feeding part may have a link coil for supplying a high frequency power to the resonance rod by the inductive coupling. Thus, the input portion of the high frequency power to the resonance rod can be non-contact, so that it is possible to reduce electric power consumption. In this case, the real part of the impedance complex number may be adjusted by adjusting the distance between the link coil and the resonance rod. Alternatively, a variable capacitor connected to the link coil may be provided, and the real part of the impedance complex number may be adjusted by adjusting the variable capacitor. Moreover, if a cylindrical link coil is provided so as to surround the resonance rod and if the real part of the impedance complex number is adjusted by adjusting the variable capacitor, it is possible to easily cause the inductive coupling even in the case of a large power.

The variable coupling feeding part may have a connection member which is movably connected to the resonance rod and which supplies a high frequency power to the resonance rod, and a moving mechanism for moving a connection member in longitudinal directions of the resonance rod, and may adjust a real part of an impedance complex number by adjusting the position of the connection member by the moving mechanism.

Alternatively, the variable coupling feeding part may have a connection member which is movably connected to the resonance rod and which supplies a high frequency power to the resonance rod, and a variable capacitor which is arranged in series to the connection member, and may adjust a real part of an impedance complex number by adjusting the variable capacitor.

If the motor of the variable capacitor connected to the resonance rod and the plasma producing electrode in series is provided on the side of the other end via a rotation shaft provided in the resonance rod, it is possible to easily ensure insulation since that portion has a ground potential.

The frequency of the high frequency power supply is preferably 70 MHz or higher. In this frequency range, the effects of the present invention can be effectively provided.

The variable capacitor connected to the resonance rod and the plasma producing electrode in series is preferably mounted directly on the plasma producing electrode. Thus, similar to the second aspect of the present invention, it is possible to reduce ununiformity and energy loss due to the discontinuity of electric characteristics, and it is possible to miniaturize the unit.

In the second aspect of the present invention, the variable capacitor is preferably mounted directly on the plasma electrode when the matching unit is mounted directly on the plasma producing electrode.

In the first and second aspects of the present invention, the variable capacitor is detachably mounted by a multi-plane contact member having a plurality of contacts when it is mounted directly on the plasma producing electrode. Thus, it is possible to facilitate handling and maintenance. In this case, if the variable capacitor has such a structure that one electrode of the variable capacitor serves as a part of the plasma producing electrode and that the other electrode is provided via air serving as an insulating layer, it is possible to simplify the structure, and it is possible to reduce the capacity of the capacitor.

BRIEF DESCRIPTION OF THE DRAWINGS

FIG. 1 is a sectional view schematically showing a plasma processing to which the present invention is applied;

FIG. 12 is a sectional view of another preferred embodiment of a matching unit according to the present invention;

FIG. 13 is a plan view of a multi-plane contact member which is used for the connection of the matching unit of FIG. 12;

FIG. 14 is a schematic diagram showing an example of the use of a variable capacitor having such a structure that one of electrodes serves as a part of a top electrode and that the other electrode is provided via air serving as an insulating layer;

FIG. 15 is a schematic diagram showing another example of the use of a variable capacitor having such a structure that one of electrodes serves as a part of a top electrode and that the other electrode is provided via air serving as an insulating layer;

FIG. 16 is a schematic diagram of a matching unit which is used for a conventional plasma processing unit; and FIG. 17 is a schematic diagram of a matching unit of a stub system.

BEST MODE FOR CARRYING OUT THE INVENTION

Figure 2A:
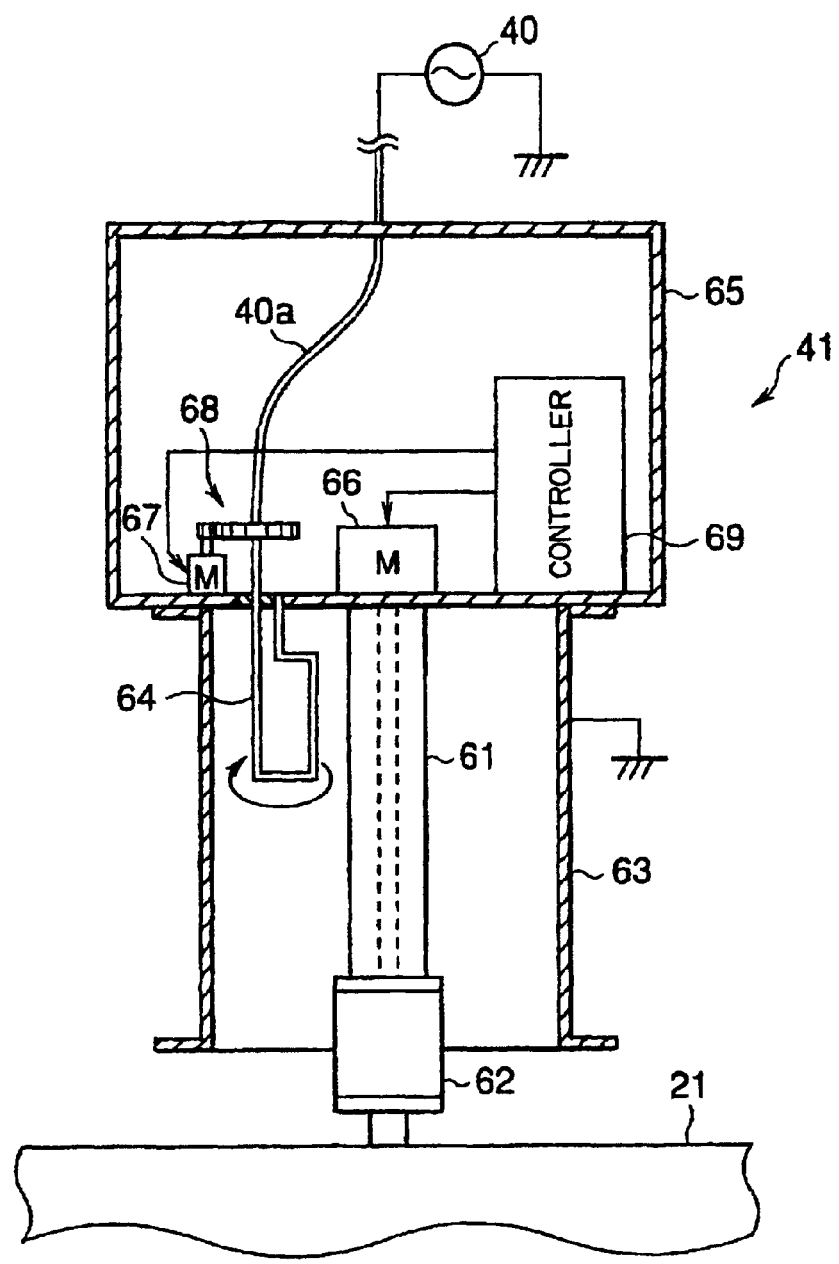
FIG. 2(a) is a sectional view of a matching unit which is used for the plasma processing system of FIG. 1.

Referring now to the accompanying drawings, the preferred embodiments of the present invention will be described below.

FIG. 1 is a sectional view schematically showing a plasma processing system to which the present invention is applied. This plasma processing system 1 is a capacitive coupled parallel plate etching system wherein top and bottom electrode plates face in parallel to each other and wherein a plasma forming power supply is connected to one of the electrodes and an ion extracting power supply is connected to the other electrode.

The plasma etching processing system 1 has a cylindrical chamber 2 of aluminum, the surface of which is alumite-processed (anodized). This chamber 2 is safety-grounded. A substantially cylindrical susceptor supporting table 4 for mounting thereon an object to be processed, e.g., a semiconductor wafer (which will be hereinafter referred to as a "wafer") W, is provided on the bottom in the chamber 2 via an insulating plate 3 of a ceramic or the like. A susceptor 5 constituting a bottom electrode is provided on the susceptor supporting table 4. The susceptor 5 is connected to a high-pass filter (HPF) 6.

A refrigerant chamber 7 is provided in the susceptor supporting table 4. A refrigerant is fed into the refrigerant chamber 7 via a refrigerant feed pipe 8 to be discharged from a refrigerant discharge pipe 9 to be circulated. The cold of the refrigerant is transferred to the wafer W via the susceptor 5, so that the temperature of the processed surface of the wafer W is controlled to be a desired temperature.

On the susceptor 5, an electrostatic chuck 11 having substantially the same shape of the wafer W is provided. The electrostatic chuck 11 has an electrode 12 provided between insulating materials, and is designed to electrostatically absorb the wafer W by Coulomb force or the like when a dc voltage is applied thereto from a dc power supply 13 connected to the electrode 12.

The insulating plate 3, the susceptor supporting plate 4, the susceptor 5 and the electrostatic chuck 11 have a gas passage 14 for supplying a heat transfer medium, e.g., He gas, to the reverse surface of the wafer W serving as the object to be processed. The cold of the susceptor 5 is transferred to the wafer W via the heat transfer medium, so that the temperature of the wafer W is maintained to be a predetermined temperature.

On the top peripheral edge of the susceptor 5, an annular focus ring 15 is arranged so as to surround the wafer W which is mounted on the electrostatic chuck 11. The focus ring 15 is made of a conductive material, such as silicon. Thus, the uniformity of etching is improved.

Above the susceptor 5, a top electrode 21 facing the susceptor 5 in parallel thereto is provided. The top electrode 21 is supported on the upper portion of the chamber 2 via an insulating material 25, and forms a surface facing the susceptor 5. The top electrode 21 comprises: an electrode plate 23 which has a large number of discharge holes 24 and which is made of, e.g., silicon, SiC or amorphous carbon; and a water-cooling electrode supporting body 22 of a conductive material, e.g., aluminum, the surface of which is alumite-processed. Furthermore, the susceptor 5 is spaced from the top electrode 21 by, e.g., about 10 to 60 mm.

The electrode supporting body 22 of the top electrode 21 has a gas inlet 26. The gas inlet 26 is connected to a gas supply pipe 27 which is connected to a process gas supply source 30 via a valve 28 and a mass flow controller 29. A process gas for a plasma etching process is supplied from the process gas supply source 30.

As the process gases, various process gases having been conventionally used may be adopted. For example, halogen containing gases, such as fluorocarbon gas ($C_xF_y$) and hydrofluorocarbon gases ($C_pH_qF_r$), may be suitably used. In addition, a rare gas, such as Ar or He, or $N_2$ may be added.

The bottom of the chamber 2 is connected to an exhaust pipe 31 which is connected to an exhaust system 35. The exhaust system 35 is equipped with a vacuum pump, such as a turbo-molecular pump, by which the interior of the chamber 2 can be evacuated to a predetermined reduced pressure atmosphere, e.g., a predetermined pressure of 0.1 mTorr or less. The side wall of the chamber 2 is provided with a gate valve 32. While the gate valve 32 is open, the wafer W is carried in and out of an adjacent load-lock chamber (not shown).

The top electrode 21 is connected to the first high frequency power supply 40, and a matching unit 41 is provided between the first high frequency power supply 40 and the top electrode 21. The matching unit 41 has the function of matching impedance of plasma to impedance of a transmission path 40a having a coaxial structure extending from the high frequency power supply 40 when plasma is formed in the chamber 2. The impedance of the transmission path 40a viewed from the high frequency power supply 40 is usually 50Ω. The feeding to the top electrode 21 is carried out from the central portion of the top face thereof. The top electrode 21 is connected to a low-pass filter (LPF) 42. The first high frequency power supply 40 has a frequency of 70 MHz or higher. By applying such a high frequency, it is possible to form a high density plasma to carry out a plasma processing under a low pressure condition of 10 mTorr or less, so that it is possible to cope with the scale down of the design rule.

The susceptor 5 serving as the bottom electrode is connected to the second high frequency power supply 50, and a matching unit 51 is provided in its feeder line. The second high frequency power supply 50 is designed to draw ions into the wafer W to apply an appropriate ion action to the wafer W without damaging the wafer W. The frequency of the second high frequency power supply 50 is 2 MHz.

The matching unit 41 will be described below.

As described above, the matching unit 41 is designed to match impedance of plasma to impedance of the transmission path 40a when plasma is formed in the chamber 2. As shown in FIG. 2(a), the matching unit 41 comprises: a resonance rod 61 for transmitting a high frequency energy from the high frequency power supply 40 to the top electrode 21; a variable capacitor 62 which is connected to the resonance rod 61 and the top electrode 21 in series; a housing 63 which is provided so as to surround the resonance rod 61 and which is grounded; a link coil 64 which is inductive-coupled to the resonance rod 61 and which functions as a variable coupling feeding part having a variable degree of coupling; and a control unit 65 which is provided above the housing 63. The variable capacitor 62 and the link coil 64 are adjusted so that portions from the high frequency power supply 40 to the ground via plasma constitute a series resonance circuit in a matching state when plasma is produced.

Assuming that impedance of plasma (high frequency load) is Z, Z can be expressed as a complex number as shown by the following expression:

$$Z = R + jX$$

wherein R is a real part of impedance which is a pure resistance component, and X is an imaginary part of impedance which is a reactance component. The impedance real part R can be adjusted by the degree of coupling, and the impedance imaginary part X can be adjusted by the series variable capacitor 62. In a resonance state, the capacity of the series variable capacitor 62 is adjusted so that the impedance imaginary part jX and the value of the capacity of the series variable capacitor 62 have the same value having different signs. Since the degree of coupling can be adjusted by the link coil 64, the total impedance real part viewed from the high frequency power supply, which includes the plasma impedance real part R, can be adjusted by the link coil 64. Therefore, it is possible to match the impedance of plasma to the transmission path impedance by adjusting impedance by the variable capacitor 62 and the link coil 64.

Figure 2B:
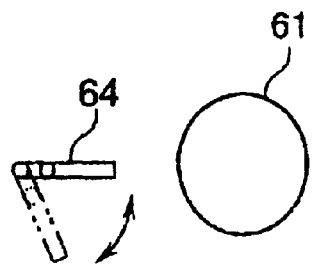
FIG. 2(b) is a schematic diagram showing a method for adjusting the degree of coupling of a link coil.

The control unit 65 has a motor 66 for adjusting the capacity of the variable capacitor 62, a motor 67 for rotating the link coil 64, and a controller 69 for controlling these motors. By this controller 69, the capacity of the variable capacitor 62 and the value of the degree of coupling of the link coil 64 are controlled in accordance with the impedance of plasma. Furthermore, the link coil 64 is rotated by the motor 67 via a gear mechanism 68 as shown in FIG. 2(*b*). In accordance therewith, the distance between the link coil 64 and the resonance rod 61 varies, so that the degree of coupling is variable.

Figure 3:
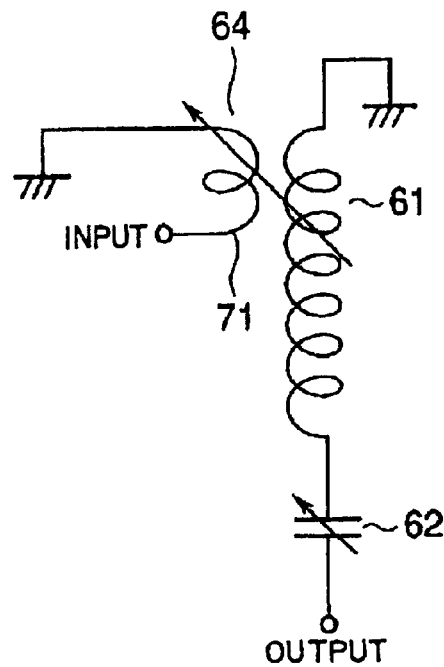
FIG. 3 is an equivalent circuit diagram of the matching unit of FIG. 2.

The link coil 64 is connected to the high frequency power supply 40 via the transmission line 40*a*, so that a high frequency power is supplied to the resonance rod 61 by the inductive coupling. Then, the distance between the link coil 64 and the resonance rod 61 is adjusted by moving the link coil 64 by means of the motor 67 and the gear mechanism 68 which serve as a driving part, so that the degree of coupling is variable. Thus, it is possible to adjust impedance. The equivalent circuit of this matching unit 40 is shown in FIG. 3.

The resonance rod 61 is preferably formed of copper with silver plating from the standpoints of electric characteristics and other characteristics. The resonance rod 61 and the housing 63 are arranged so as to be coaxial with each other. Thus, the distance between the resonance rod 61 and the housing 63 is constant regardless of their positions, so that the distribution of the electromagnetic field can be uniform. Therefore, it is easy to manage the estimation of inductance of the resonance rod 61. In particular, the resonance rod 61 is hollow and cylindrical to be coaxial with the outer housing 63, so that the distribution of the electromagnetic field can be more uniform. Of course, the shape of the housing 63 should not be limited to the cylindrical shape. The shape of the housing 63 may be an angular box shape, and the housing 63 may not always cover the whole resonance rod 61. The resonance rod 61 may be other than cylindrical. Furthermore, the equivalent reactance of the resonance rod 61 can be estimated on the basis of its length and a ratio of its diameter to the diameter of the outer housing 63.

The processing operation of the plasma processing system 1 with the above described construction will be described below.

First, after the gate valve 32 is open, the wafer W serving as an object to be processed is carried in the chamber 2 from a load-lock chamber (not shown) to be mounted on the electrostatic chuck 11. Then, a dc voltage is applied from the high-voltage dc power supply 13, so that the wafer W is electrostatically absorbed on the electrostatic chuck 11. Then, the gate valve 32 is closed, and the chamber 2 is evacuated to a predetermined degree of vacuum by means of the exhaust mechanism 35.

Thereafter, the valve 28 is opened to feed a process gas from the process gas supply source 30 into the top electrode 21 via the process gas supply pipe 27 and the gas inlet 26 while the flow rate of the process gas is adjusted by the mass flow controller 29. Then, as shown by arrow in FIG. 1, the process gas passes through the discharge holes 24 of the electrode plate 23 to be uniformly discharged onto the wafer W, and the pressure in the chamber 2 is maintained to be a predetermined value.

Thereafter, a high frequency power of 70 MHz or higher, e.g., 150 MHz, is applied from the first high frequency power supply 40 to the top electrode 21 via the matching unit 41. Thus, a high frequency electric field is generated between the top electrode 21 and the susceptor 5 serving as the bottom electrode, so that the process gas is dissociated to be plasma, with which the wafer W is etched.

On the other hand, a high frequency power of 2 MHz is applied from the second high frequency power supply 50 to the susceptor 5 serving as the bottom electrode. Thus, ions in the plasma are drawn into the susceptor 5, so that the anisotropy of etching is enhanced by ion assist.

If the frequency of the high frequency power applied to the top electrode 21 is thus set to be 70 MHz or higher, the density of plasma can be raised to carry out a plasma processing at a lower pressure to cope with the scale down of the design rule.

If the frequency of the high frequency power is thus 70 MHz or higher, the value of the variable capacitor in conventional matching units must be considerably low, so that it is difficult to apply commercially available variable capacitor. In addition, in the case of a matching unit of a stub system, the size of the matching unit increases, and it takes a lot of time to carry out the matching.

This tendency becomes remarkable when the frequency of the high frequency power is 100 MHz or higher.

On the other hand, in the above described matching unit 41, the outer housing 63 constitutes the series resonance circuit together with the resonance rod 61 and variable capacitor 62 which are arranged so as to be coaxial therewith. Specifically, the variable capacitor 62 and the link coil 64 are controlled by the controller 69 so that a series resonance circuit is formed in the matching state between the high frequency power supply 40 and plasma. Thus, since the series resonance circuit is formed in the matching state between the high frequency power supply and plasma as a simple structure that the matching unit 41, the resonance rod 61 and the variable capacitor 62 are arranged in series, it is possible to essentially miniaturize the matching unit 41. In addition, the inductance component itself of the resonance rod 61 can be decreased by providing the housing 63, and the inductive reactance component of the resonance circuit can be easily managed if the distance between the resonance rod 61 and the housing 63 is adjusted. Therefore, even if a commercially available variable capacitor is used as the variable capacitor 62, the impedance of plasma can be sufficiently matched with the impedance of the transmission path 40*a*.

Figure 4:
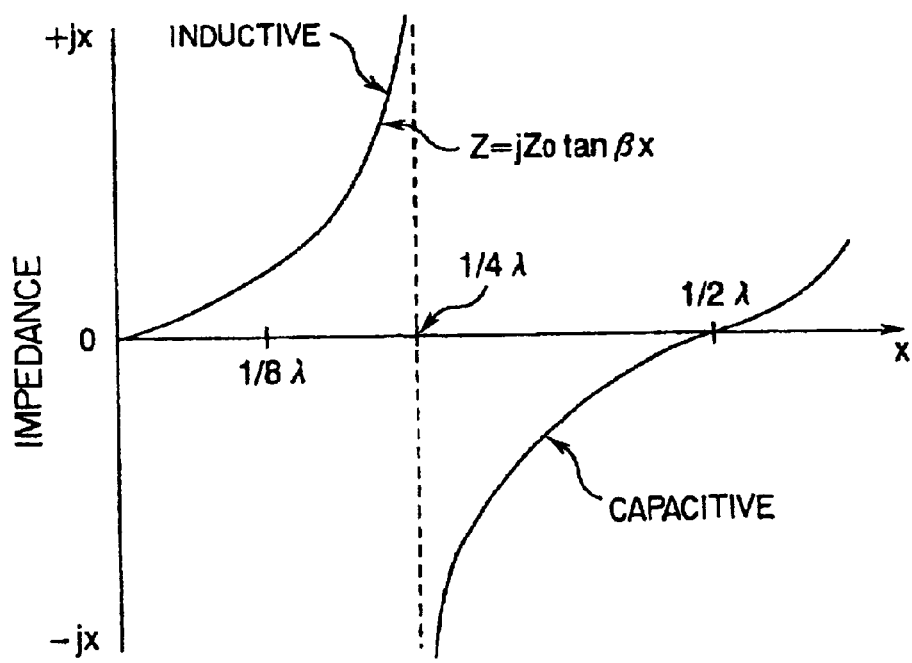
FIG. 4 is a graph showing the relationship between length and impedance when a resonance rod having a coaxial structure is used.

Assuming that the characteristic impedance of the resonance rod 61 having the coaxial structure is $Z_0$, the impedance Z in the case of a length x is expressed by the following expression (1)

$$Z = jZ_0 \tan\beta x \qquad (1)$$

wherein $\beta$ denotes a phase constant, and $\beta = 2\pi/\lambda$ assuming that wavelength is $\lambda$. Therefore, the relationship between length and impedance (i.e., reactance of the resonance rod 61) is as shown in FIG. 4. Furthermore, the characteristic impedance $Z_0$ is a logarithmic function of a ratio of a sectional dimension (diameter) of the resonance rod 61 to that of the outer housing 63. In FIG. 4, when x is less than ¼ wavelength, the resonance rod 61 functions a coil (inductance) to be associated with the series variable capacitor 62 to form a series resonance circuit. In this case, the resonance rod 61 is surrounded by the grounded housing 63, so that the length should be set in view of a wavelength shortening rate (velocity rate constant). If the length of the resonance rod 61 is thus less than ¼ wavelength of the high frequency wave, the actual length of the resonance rod 61 can drastically be as short as approximately 100 mm even in the case of a frequency of 70 MHz or higher, so that the matching unit 41 can be sufficiently miniaturized. Furthermore, when the reactance of the load of plasma is inductive and large, the length of the resonance rod 61 can be longer than ¼ wavelength to cause the resonance rod 61 to function as a capacitor to form a series resonance circuit. In this case, the matching unit 41 is not enlarged unlike the stub system although the length of the resonance rod 61 will become longer than the above described case with less than ¼ wavelength.

In addition, since the reactance of the load of plasma can be cancelled because the resonance circuit is formed, the apparent High current viewed from the high frequency power supply can be canceled, and the reactive power which does not attribute to plasma formation can be almost nil. Therefore, the energy efficiency is high. Moreover, since the number of connection points is small in the resonance circuit, it is possible to form a low-loss, high-performance resonance circuit having a low internal loss. In addition, since the variable capacitor is basically used for carrying out the matching similar to conventional units, the matching time is not long unlike the stub system. Moreover, the shielding effect can be enhanced due to the presence of the housing 63. Furthermore, the matching unit 41 can have a cylindrical shape having a diameter of about 160 mm and a height of about 200 mm in a portion which does not include the control unit, so that the matching unit 41 can be smaller than conventional matching units.

In addition, since the link coil 64 is used for supplying the high frequency power to the resonance rod 61 in a non-contact state by the inductive coupling, it is possible to avoid a loss due to contact, so that it is possible to reduce high frequency power consumption in the matching unit.

Moreover, since the motor 66 for adjusting the capacity of the variable capacitor 62 is arranged on the top end side of the resonance rod 61 having a ground potential, i.e., a voltage of 0 V, it is easy to insulate the motor 66.

As described above, the matching unit 41 has excellent effects when the frequency of the high frequency power supply 40 is 70 MHz or higher and further 100 MHz or higher. Although the upper limit of the frequency of the high frequency power supply 40 is particularly defined unless the dimensional constraint does not exist (there is a problem on mounting if the resonance rod is extremely short), the frequency of the high frequency power supply 40 is preferably about 400 MHz or lower from the standpoint of sufficient matching. If the frequency of the high frequency power supply 40 is 300 MHz or higher where the wave length becomes relating short, the same effects can be obtained when the resonance rod 61 has a length of not only less than ¼ wavelength, but also a practical length in the range longer than 2n/4 wavelength to a length of shorter than (1+2n)/4 (n=1, 2, . . . ).

A first modified example of the matching unit 41 will be described below.

Figure 5:
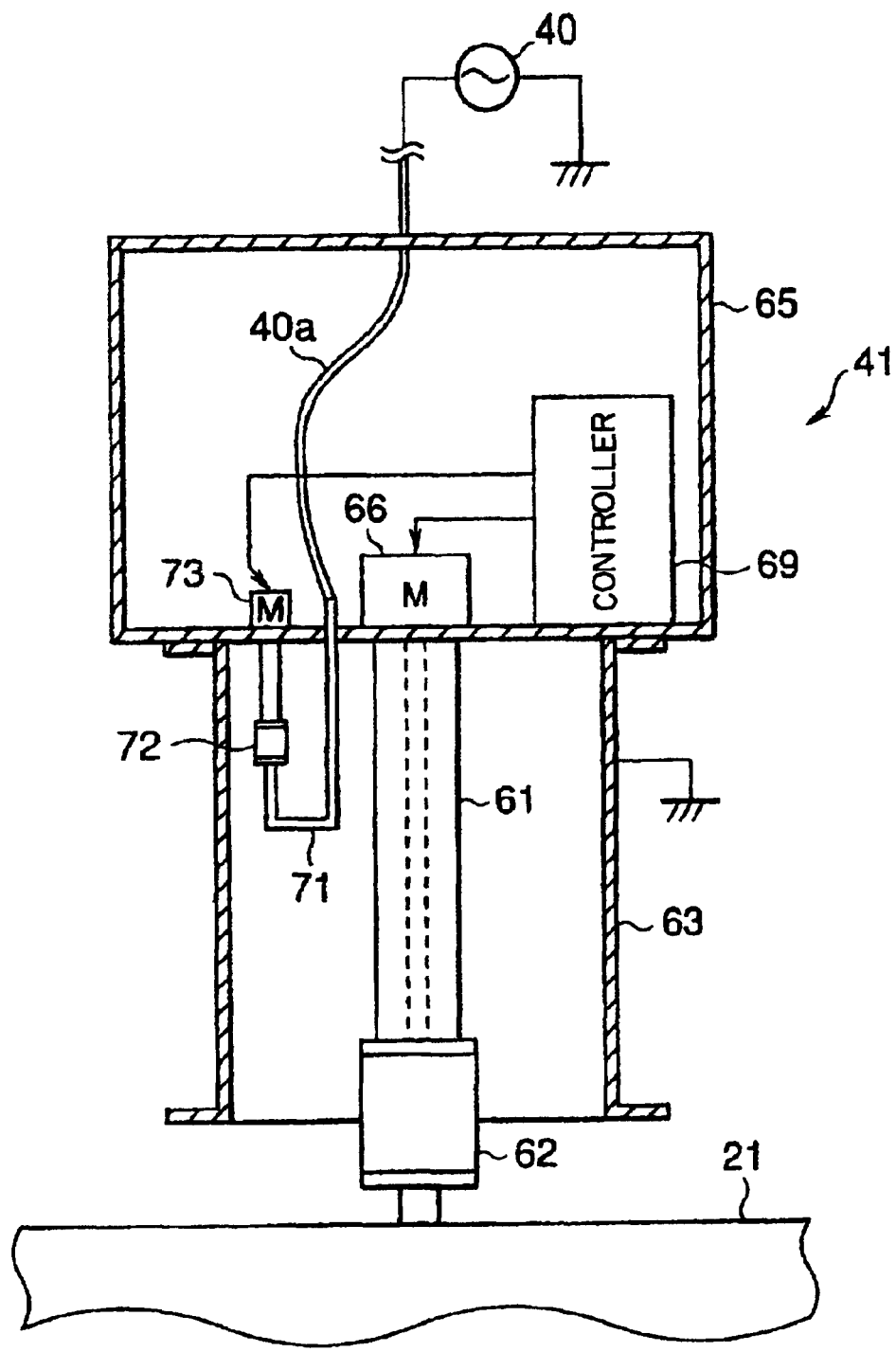
FIG. 5 is a sectional view of a first modified example of a matching unit.
Figure 6:
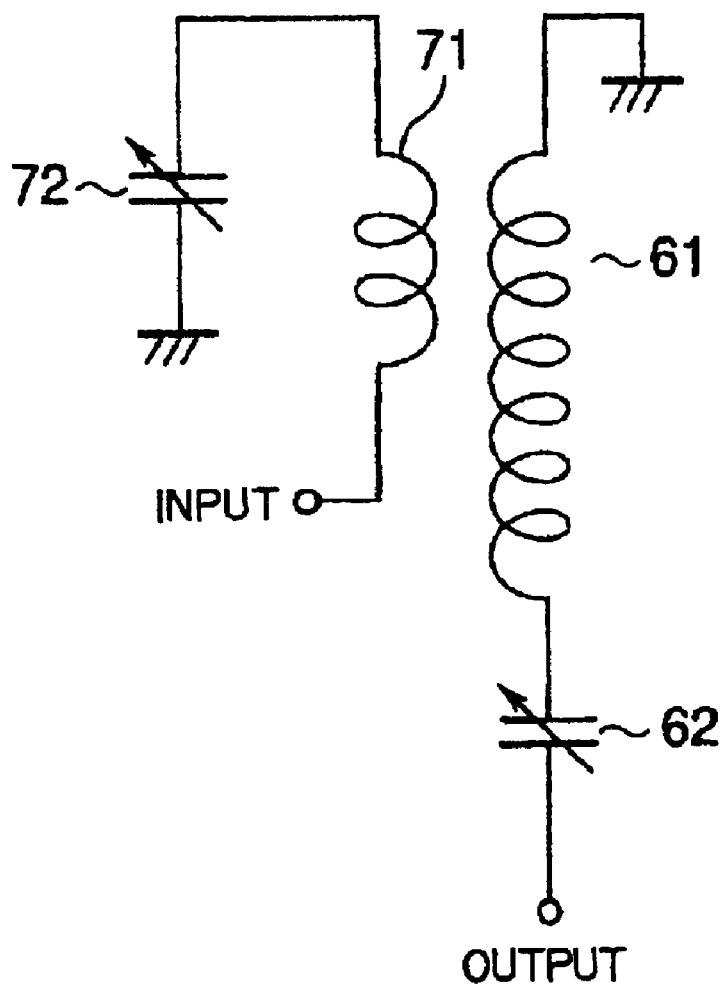
FIG. 6 is an equivalent circuit diagram of the matching unit of FIG. 5.

As shown in FIG. 5, the matching unit 41 has a fixed link coil 71 on which a variable capacitor 72 is mounted. A motor for adjusting the capacity of the variable capacitor 72 is controlled by a controller 69 in the same way as the motor 66. A high frequency power reaches the variable capacitor 72 via a feeder line 40$a$ and the link coil 71 to be supplied to a resonance rod 61 by the inductive coupling. Other constructions are the same as those in FIG. 2, and the same reference numbers are given to the same members to omit the descriptions thereof. In the case of such a construction, impedance is adjusted by the variable capacitor 72, so that it is possible to adjust impedance in a short time without moving the link coil 71. An equivalent circuit in this case is shown in FIG. 6.

A second modified example of the matching unit 41 will be described below.

Figure 7:
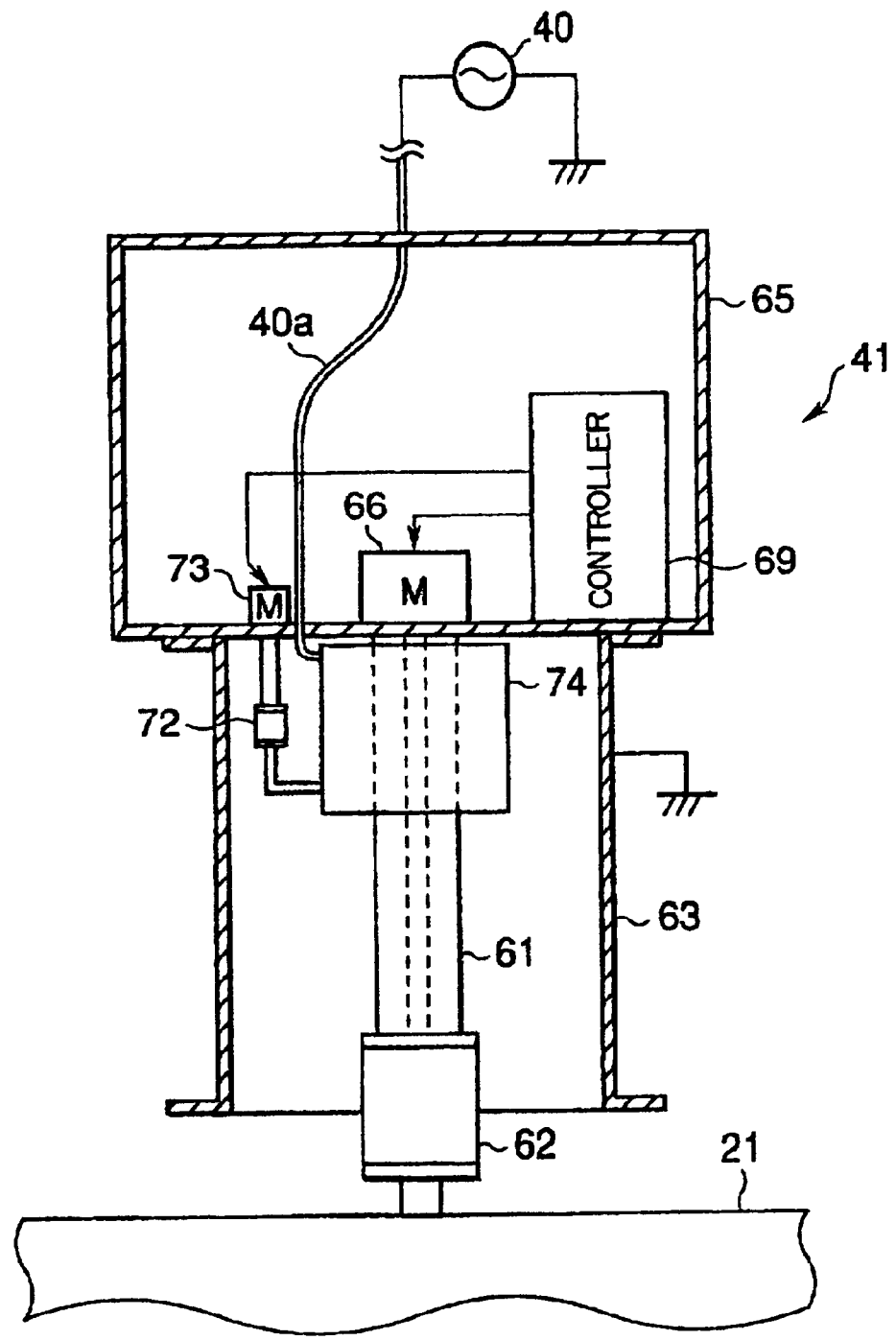
FIG. 7 is a sectional view of a second modified example of a matching unit.

As shown in FIG. 7, a cylindrical link coil 74 is arranged coaxially outside of a resonance rod 61, and a variable capacitor 72 is connected to the link coil 74. Other constructions are the same as those in FIG. 5, and the same reference numbers are given to the same members to omit the descriptions thereof. In the case of such a construction, it is possible to easily cause the inductive coupling even in the case of a large power since the cylindrical link coil 74 is arranged coaxially outside of the resonance rod 61. Furthermore, the equivalent circuit in this example is the same as that in FIG. 6.

The matching units of FIGS. 2, 5 and 7 are the same in theory as a circuit although they have slightly different structures.

A third modified example of the matching unit 41 will be described below.

Figure 8:
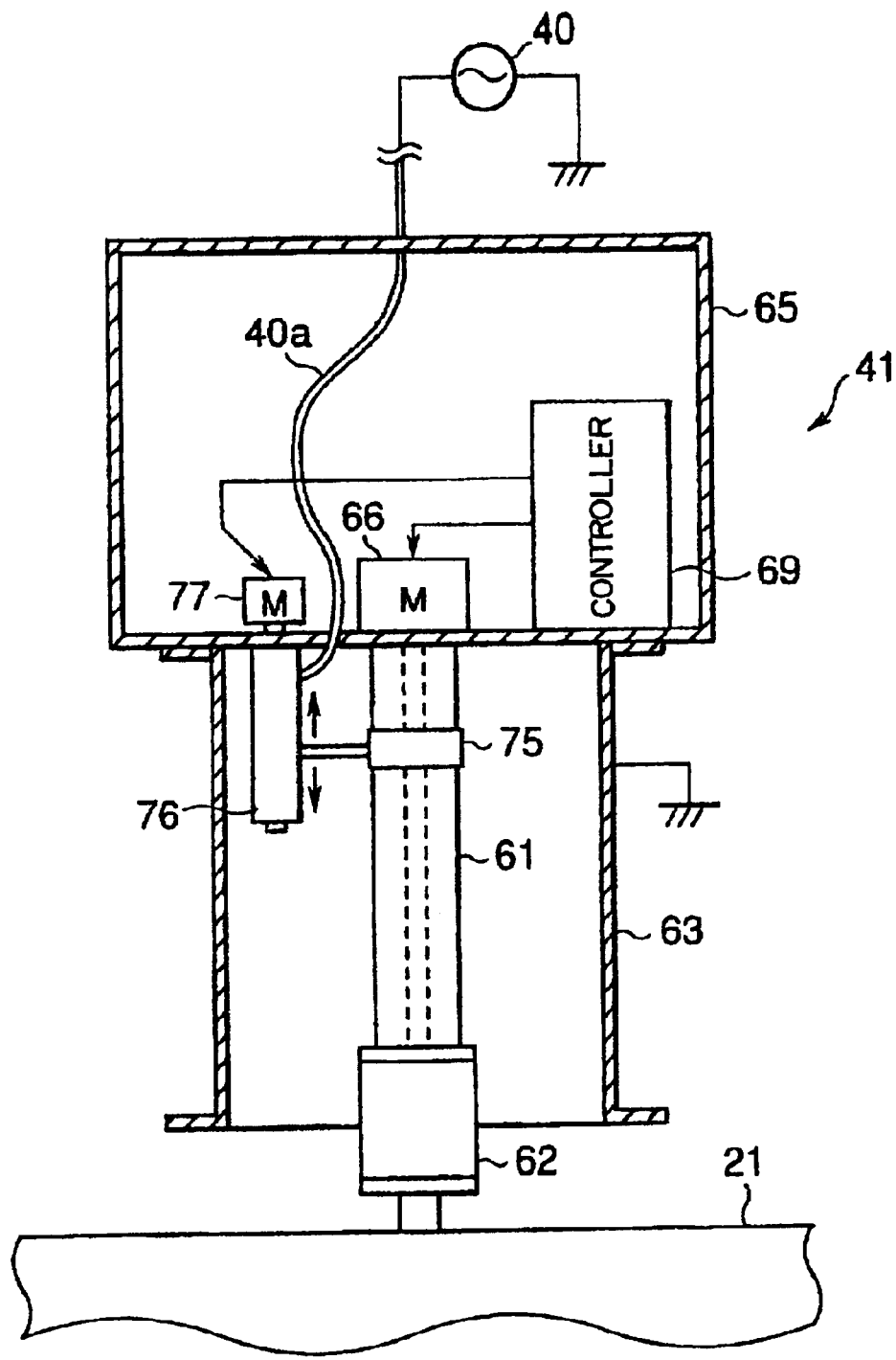
FIG. 8 is a sectional view of a third modified example of a matching unit.
Figure 9:
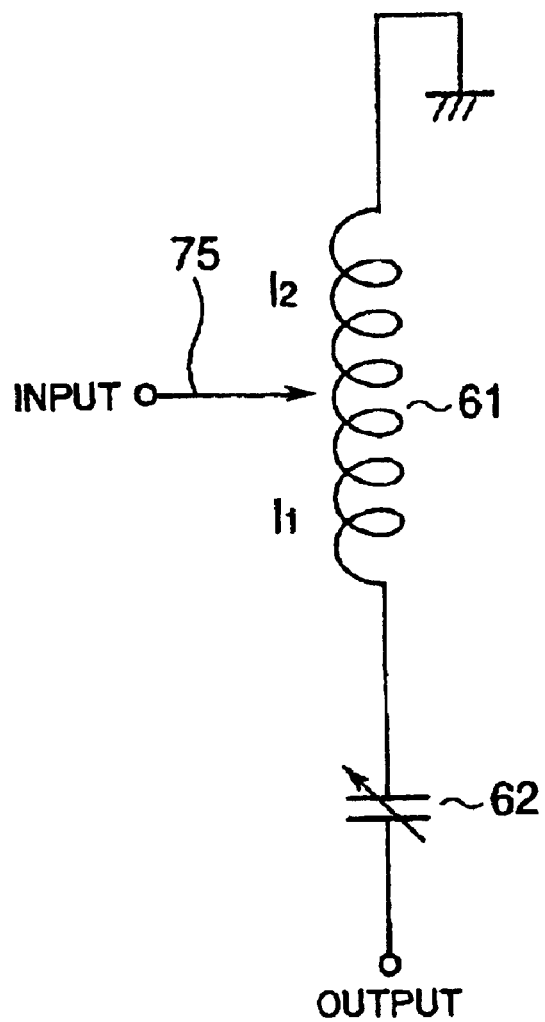
FIG. 9 is an equivalent circuit diagram of the matching unit of FIG. 8.

As shown in FIG. 8, a sliding member (connection member) 75 is slidably engaged with the outside face of a resonance rod 61, and is vertically movable by a driving mechanism 76, such as a ball screw mechanism, and a motor 77. A feeder line 40$a$ is connected to the sliding member 75. A power is fed to the resonance rod 61 via the sliding member 75. The motor 77 is controlled by a controller 69. Other constructions are the same as those in FIG. 2, and the same reference numbers are given to the same members to omit the descriptions thereof. In the case of such a construction, the high frequency power is supplied from a high frequency power supply 40 to the resonance rod 61 via the sliding member 75, so that impedance can be adjusted by adjusting the feeding position of the sliding member 75 by the driving mechanism 76 and the motor 77. Since feeding is carried out in such a contact state, it is possible to surely carry out feeding although it has a loss. An equivalent circuit in this case is shown in FIG. 9.

A fourth modified example of the matching unit 41 will be described below.

Figure 10:
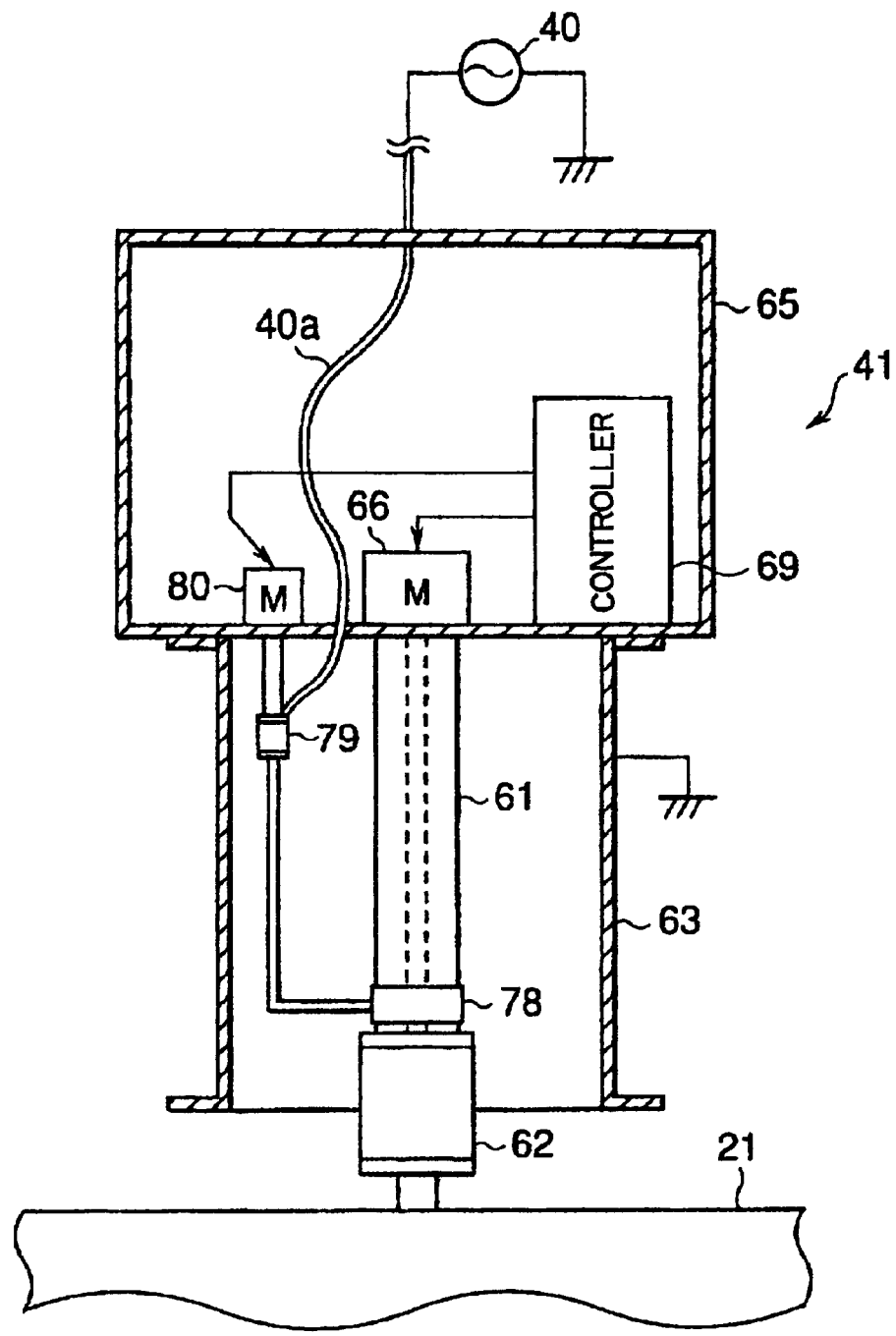
FIG. 10 is a sectional view of a fourth modified example of a matching unit.
Figure 11:
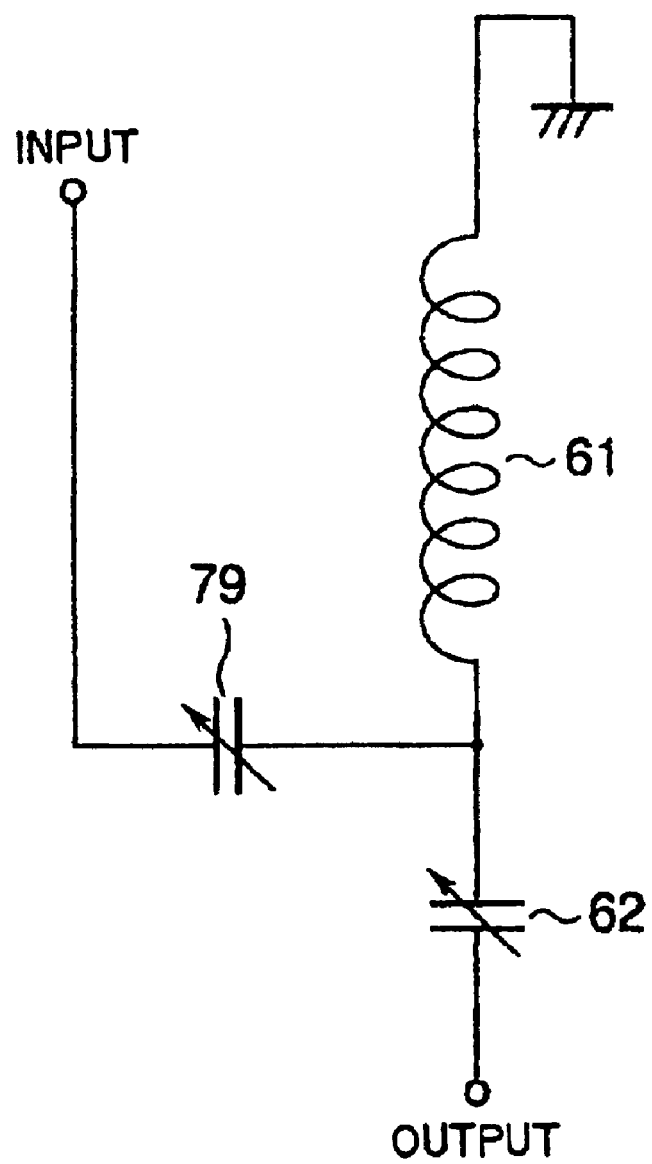
FIG. 11 is an equivalent circuit diagram of the matching unit of FIG. 10.

As shown in FIG. 10, a connection member 78 is fixed to the outside face of the bottom portion of a resonance rod 61, and a variable capacitor 79 is connected to the connection member 78. A capacity adjusting motor 80 is controlled by a controller 69 similar to the motor 66. A high frequency power reaches the connection member 78 via a feeder line 40$a$ and the variable capacitor 79 to be supplied to the resonance rod 61. Other constructions are the same as those in FIG. 2, and the same reference numbers are given to the same members to omit the descriptions thereof. In the case of such a construction, impedance is adjusted by the variable capacitor 79 without sliding the connection member 78, so that it is possible to adjust impedance in a shorter time. In addition, it is possible to surely carry out feeding since feeding is carried out while the connection member 79 contacts the resonance rod 61. An equivalent circuit in this case is shown in FIG. 11.

Another preferred embodiment of the present invention will be described below.

In this embodiment, the connection state between a matching unit and a top electrode is different from that in conventional units, and a matching unit 41' is connected directly to a top electrode 21 as shown in FIG. 12. Specifically, a bottom electrode 91a of a variable capacitor 91 existing in the bottom end portion of the matching unit 41 is connected to the top electrode 21. In this case, the bottom electrode of the variable capacitor 91 is engaged with an adapter 92. In this state, it is fitted into a multi-plane contact member 93 which is mounted for connecting the matching unit 41' to the top electrode 21. The multi-plane contact member 93 is fixed to the top electrode 21. As shown in FIG. 13, the multi-plane contact member 93 has a ring shape, and is provided with a large number of spherical contacts 93 on the inside face thereof. These contacts 93 are inwardly biased by a spring, so that it is possible to surely hold the adapter 92 by the spring force when the adapter 92 is fitted, and it is possible to realize a sure electrical connection. In addition, it is possible to easily remove the adapter 92 by lifting the adapter 92. Moreover, it is possible to further ensure the electric connection by the presence of the adapter 92. Furthermore, the adapter 92 may be connected to the electrode 91a of the capacitor 91 as the multi-plane contact member. Alternatively, another mounting member, such as a screw, may be used without the need of such a multi-plane contact member 93.

Conventionally, the matching unit is connected to the electrode by means of a feeding rod having a length of about tens through 100 mm, so that there are problems in that plasma is ununiform due to discontinuity of electric characteristics, that a loss is caused by R component, and that the matching unit is enlarged by the increase of L component of the feeding rod due to the enhancement of frequency. If a part of the matching unit 41' is thus connected directly to the top electrode 21, it is not required to provide the feeding rod, and the number of impedance discontinuous places can be decreased, so that it is possible to reduce the ununiformity of plasma and energy loss due to standing waves. In addition, since there is no influence of L component of the feeding rod, voltage is not raised at the outlet of the matching unit 41', and it is not required to increase the size of insulating materials and spaces to reinforce insulation, so that it is possible to miniaturize the unit.

By the way, the variable capacitor usually has electrodes on both ends of a dielectric ceramic cylinder, and the distance between the electrodes is varied in the ceramic cylinder which is held in vacuum. However, as shown in FIG. 14, there may be provided a variable capacitor 94 which has such a structure that one electrode 94a having ring-shaped irregularities serves as a part of a top electrode 21 and that the other electrode 94b having ring-shaped irregularities may be provided so as to engage the ring-shaped irregularities of the electrode 94a via air serving as an insulating layer, and which can change the capacity by vertically moving the electrode 94b. Thus, it is not required to use a capacitor serving as an element, so that it is possible to simplify the structure. In addition, since it is not required to use the dielectric ceramic cylinder, it is possible to decrease the capacity of the capacitor. If the required capacity is small, it is possible to use a capacitor 95 having flat electrodes 95a and 95b as shown in FIG. 15, so that it is possible to further simplify the structure.

Furthermore, the present invention should not be limited to the above described preferred embodiments, and can be embodied in various ways. For example, while the frequency of the high frequency power applied to the top electrode has been 70 MHz or higher in the above described preferred embodiments, it may be 70 MHz or lower. In addition, while the high frequency power for plasma production has been applied to the top electrode, a high frequency power for plasma production may as well be applied to the bottom electrode. Moreover, while the housing 63 has been provided so as to be coaxial with the resonance rod 61, it is not always required to coaxially provide the housing 63. The construction that the matching unit is mounted directly on the top electrode can not only be applied to a matching unit of a type that the above described resonance rod is used, but it may be also applied to a matching unit of a conventional type. While the semiconductor wafer has been used as an object to be processed and has been etched, the present invention should not be limited thereto. That is, another substrate, such as a substrate for a liquid crystal display (LCD), may be used as the object to be processed. In addition, the plasma processing should not be limited to etching, but it may be another processing, such as sputtering or CVD. Moreover, the matching unit according to the present invention can not only be applied to the plasma processing, but it may be also applied to a case where high frequency waves are transmitted, e.g., a medical facility, such as a hyperthermia device, an output portion for nuclear fusion, or an accelerator.

As described above, according to the present invention, there is formed the series resonance circuit including the resonance rod, which is surrounded by the housing, and the variable capacitor. Therefore, even if a high frequency power of 70 MHz or higher a high frequency power of 70 MHz or higher and further 100 MHz or higher is supplied, a commercially available variable capacitor can be utilized for sufficiently matching the impedance of a high frequency load with the impedance of the transmission path without increasing the size of the matching unit unlike the stub system. That is, since the series resonance circuit is formed in the matching state between the high frequency power supply and the high frequency load with being a simple structure of the matching unit, where the resonance rod and the variable capacitor are arranged in series, it is possible to essentially miniaturize the matching unit. In addition, the inductance component itself of the resonance rod can be decreased by providing the housing, and the inductive reactance component of the resonance circuit can be easily managed if the distance between the resonance rod and the housing is adjusted. Therefore, even if a commercially available variable capacitor is used, the impedance of the high frequency load can be sufficiently matched with the impedance of the transmission path. In addition, when the resonance rod is operated as a coil, the length of the resonance rod can be shorter than the ¼ wavelength of the frequency of the high frequency waves, so that it is possible to further miniaturize the unit. Moreover, since the number of connection points is small in the resonance circuit, it is possible to form a low-loss, high-performance resonance circuit having a low internal loss. In addition, since the variable capacitor is basically used for carrying out the matching similar to conventional units, the matching time is not long unlike the stub system. Moreover, the shielding effect can be enhanced due to the presence of the housing. If such a matching unit is used for forming a plasma processing system, even if a high frequency power of 70 MHz or higher and further 100 MHz or higher is supplied to produce plasma, a commercially available variable capacitor can be utilized for sufficiently matching the impedance of plasma with the impedance of the transmission path without increasing the size of the system unlike the stub system.

From the other standpoint of the present invention, since the matching unit is mounted directly on the plasma producing electrode, it is not required to provide the feeding rod, and it is possible to decrease the number of impedance discontinuous places. Therefore, it is possible to reduce ununiformity and energy loss due to the discontinuity of electric characteristics. In addition, since there is no influence of inductive reactance component of the feeding rod, voltage is not raised at the outlet of the matching unit. Therefore, it is not required to increase the size of insulating materials and spaces to reinforce insulation, so that it is possible to miniaturize the unit. If such a matching unit is used for forming a plasma processing system, it is possible to reduce the ununiformity of plasma and energy loss due to the discontinuity of electric characteristics.

What is claimed is:

1. A matching unit, provided between a high frequency power supply and a high frequency load introducing part, for matching an impedance of a high frequency load with a transmission path impedance, said matching unit comprising:
   a resonance rod for transmitting a high frequency energy from a high frequency power supply to a high frequency load introducing part;
   a variable capacitor, connected to said resonance rod and said high frequency load introducing part in series, for adjusting an imaginary part of an impedance complex number;
   a housing which is provided outside of said resonance rod and which is grounded; and
   a variable coupling feeding part for exciting a high frequency energy to said resonance rod and for adjusting a real part of the impedance complex number,
   wherein said variable capacitor and said variable coupling feeding part are adjusted so that a series resonance circuit is formed between said high frequency power supply and said high frequency load in a state that the impedance of said high frequency load is matched with the transmission path impedance.

2. A matching unit as set forth in claim 1, wherein said high frequency load introducing part is a plasma producing electrode, and said high frequency load is plasma.

3. A matching unit as set forth in claim 1, which further comprises control means for controlling said variable capacitor and said variable coupling feeding part.

4. A matching unit as set forth in claim 1, wherein said resonance rod and said housing are provided so as to be coaxial with each other.

5. A matching unit as set forth in claim 1, wherein said variable coupling feeding part has a link coil for supplying a high frequency power to said resonance rod by the inductive coupling.

6. A matching unit as set forth in claim 5, wherein said variable coupling feeding part adjusts impedance by adjusting the distance between said link coil and said resonance rod.

7. A matching unit as set forth in claim 5, wherein said variable coupling feeding part has a variable capacitor which is connected to said link coil, and adjusts impedance by adjusting said variable capacitor.

8. A matching unit as set forth in claim 7, wherein said link coil is cylindrical, and is provided so as to surround said resonance rod.

9. A matching unit as set forth in claim 1, wherein said variable coupling feeding part has a connection member which is movably connected to said resonance rod and which supplies a high frequency power to said resonance rod, and a moving mechanism for moving a connection member in longitudinal directions of said resonance rod, said variable coupling feeding part adjusting a real part of an impedance complex number by adjusting the position of said connection member by said moving mechanism.

10. A matching unit as set forth in claim 1, wherein said variable coupling feeding part has a connection member which is movably connected to said resonance rod and which supplies a high frequency power to said resonance rod, and a variable capacitor which is arranged in series to said connection member, said variable coupling feeding part adjusting a real part of an impedance complex number by adjusting said variable capacitor.

11. A matching unit as set forth in claim 1, wherein said variable capacitor connected to said resonance rod and said high frequency load introducing part in series has a motor for changing the capacitance of said variable capacitor, said motor being provided on the side of the other end via a rotation shaft provided in said resonance rod.

12. A matching unit as set forth in claim 1, wherein said high frequency power supply has a frequency of 70 MHz or higher.

13. A matching unit as set forth in claim 1, wherein said variable capacitor connected to said resonance rod and said high frequency load introducing part in series is mounted directly on said plasma producing electrode.

14. A matching unit as set forth in claim 13, wherein said variable capacitor is detachably mounted by a multi-plane contact member having a plurality of contacts.

15. A matching unit as set forth in claim 13, wherein said variable capacitor has a structure that one electrode of said variable capacitor serves as a part of said plasma producing electrode and that the other electrode is provided via air serving as an insulating layer.

16. A matching unit, provided between a high frequency power supply and a plasma producing electrode, for matching an impedance of a high frequency load with a transmission path impedance, said matching unit being mounted directly on said plasma producing electrode,
   said matching unit having a variable capacitor for adjusting an imaginary part of an impedance complex number of a high frequency load, said variable capacitor being mounted directly on said plasma producing electrode.

17. A matching unit as set forth in claim 16, wherein said variable capacitor being detachably mounted by a multi-plane contact member has a plurality of contacts.

18. A matching unit as set forth in claim 16, wherein said variable capacitor has a structure that one electrode of said variable capacitor serves as a part of said plasma producing electrode and that the other electrode is provided via air serving as an insulating layer.

19. A plasma processing system comprising:
   a chamber for housing therein an object to be processed;
   first and second electrodes which are provided so as to face each other in said chamber;
   a high frequency power supply for supplying a high frequency power to said first electrode;
   a matching unit, provided between said high frequency power supply and said first electrode, for matching a plasma impedance with a transmission path impedance;
   exhaust means for maintaining the interior of said chamber in a predetermined reduced pressure state; and process gas feed means for feeding a process gas into said chamber, said plasma processing system forming a high frequency electric field between said first and second electrodes by said high frequency power to produce the plasma of said process gas to carry out a plasma processing, said matching unit comprising:

a resonance rod for transmitting a high frequency energy from said high frequency power to said first electrode;

a variable capacitor, connected to said resonance rod and said first electrode in series, for adjusting an imaginary part of an impedance complex number;

a housing which is provided outside of said resonance rod and which is grounded; and a variable coupling feeding part for exciting a high frequency energy to said resonance rod and for adjusting a real part of the impedance complex number, wherein said variable capacitor and said variable coupling feeding part are adjusted so that a series resonance circuit is formed between said high frequency power and the ground via said plasma in a state that the impedance of a high frequency load is matched with a transmission path impedance.

20. A plasma processing system as set forth in claim 19, wherein said high frequency power supply has a frequency of 70 MHz or higher.

21. A plasma processing system comprising:

a chamber for housing therein an object to be processed;

first and second electrodes which are provided so as to face each other in said chamber;

a high frequency power supply for supplying a high frequency power to said first electrode;

a matching unit, provided between said high frequency power supply and said first electrode, for matching a plasma impedance with a transmission path impedance;

exhaust means for maintaining the interior of said chamber in a predetermined reduced pressure state; and process gas feed means for feeding a process gas into said chamber, said plasma processing system forming a high frequency electric field between said first and second electrodes by said high frequency power to produce the plasma of said process gas to carry out a plasma processing, said matching unit being mounted directly on said first electrode and having a variable capacitor for adjusting an imaginary part of an impedance complex number of high frequency load, said variable capacitor being mounted directly on said first electrode.

* * * * *